US012392847B2

(12) United States Patent
Myer et al.

(10) Patent No.: US 12,392,847 B2
(45) Date of Patent: Aug. 19, 2025

(54) RADIO FREQUENCY POWER AMPLIFIER SYSTEM FOR MAGNETIC RESONANCE IMAGING

(71) Applicants: Daniel P. Myer, Commack, NY (US); J. Thomas Vaughan, New York, NY (US); Michael Kozma, Rockville Centre, NY (US)

(72) Inventors: Daniel P. Myer, Commack, NY (US); J. Thomas Vaughan, New York, NY (US); Michael Kozma, Rockville Centre, NY (US)

( * ) Notice: Subject to any disclaimer, the term of this patent is extended or adjusted under 35 U.S.C. 154(b) by 148 days.

(21) Appl. No.: 18/390,151

(22) Filed: Dec. 20, 2023

(65) Prior Publication Data
US 2024/0210503 A1    Jun. 27, 2024

Related U.S. Application Data

(60) Provisional application No. 63/434,163, filed on Dec. 21, 2022.

(51) Int. Cl.
*G01R 33/36* (2006.01)
(52) U.S. Cl.
CPC ..... *G01R 33/3614* (2013.01); *G01R 33/3664* (2013.01)

(58) Field of Classification Search
CPC ............ G01R 33/3614; G01R 33/3664; G01R 33/3621
See application file for complete search history.

(56) References Cited

U.S. PATENT DOCUMENTS

2009/0128153 A1\* 5/2009 Graesslin ........... G01R 33/3607
324/322

\* cited by examiner

*Primary Examiner* — G.M. A Hyder
(74) *Attorney, Agent, or Firm* — Collard & Roe, P.C.

(57) ABSTRACT

A radio frequency amplifier system for a magnetic resonance imaging (MRI) apparatus has a radio frequency power amplifier configured to transmit a B1 radiofrequency signal to a patient coil present in the MRI apparatus and a first directional coupler that splits the B1 signal from the amplifier into a transmitted B1 signal and a B1 error signal. A circulator transmits the transmitted B1 signal to a patient coil, and receives and transmits a reflected B1 signal and an MRI signal from the patient coil. The signals received from the patient coil are fed to a control loop. The components of the control loop modify the B1 error signal so that the B1 error signal cancels the B1 reflected signal such that the transmitted signal consists only of the MRI signal without a B1 signal, which is then sent to a low noise MRI signal amplifier and on for diagnostic analysis.

13 Claims, 3 Drawing Sheets

RADIO FREQUENCY POWER AMPLIFIER SYSTEM FOR MAGNETIC RESONANCE IMAGING

CROSS-REFERENCE TO RELATED APPLICATIONS

This application claims priority under 35 USC 119(e) of United States Provisional Application Ser. No. 63/434,163, filed on Dec. 21, 2022, the disclosure of which is herein incorporated by reference.

1. FIELD OF THE INVENTION

This invention relates to a radio frequency (RF) power amplifier for use in magnetic resonance imaging (MRI) machines. In particular, the invention relates to an MRI system utilizing an RF amplifier that can operate with a continuous signal (simultaneous transmit and receive MRI), thus requiring a much lower power output than with conventional amplifiers and MRI RF system architecture.

2. THE PRIOR ART

MRI is a widely used diagnostic imaging technique that relies on the interaction of RF electromagnetic fields with the nuclear magnetic moments of the atoms within a subject (human patient) to produce detailed images for medical diagnosis. In a typical MRI machine, a static magnetic field (B0) is applied to the system. A pulsed B1 magnetic field (created by the RF amplifiers B1 signal) is then applied perpendicular to the B0 field to cause the excitation of the atoms. RF power amplifiers are essential to the function of the components in the MRI system, as they are responsible for generating the high-power RF signals required for the B1 magnetic field in the excitation and detection of nuclear magnetic resonance in the subject.

In conventional MRI systems, RF power amplifiers have been designed and utilized to provide pulsed RF signals for spatially selective excitation of nuclear spins within the subject. The resulting signals emitted by the subject during relaxation between the pulses are amplified by low noise amplifiers after being received by Transmit/Receiver (T/R) coils for image reconstruction.

The state of the art in MRI RF power amplifiers has focused on achieving high power output, excellent linearity, and low noise. These characteristics are crucial for ensuring efficient excitation and signal reception, as well as maintaining the high image quality and signal-to-noise ratio necessary for accurate diagnosis. Typical RF power amplifiers employ various technologies, such as solid-state transistors (e.g., LDMOS and or VMOS) or vacuum tubes each with its own advantages and limitations.

Efforts in the field have also aimed to minimize power dissipation, improve heat management, and enhance reliability, as MRI examinations can be lengthy, and the performance of RF power amplifiers directly impacts patient comfort and the efficiency of clinical workflows. Furthermore, advancements in digital signal processing techniques have been integrated to control RF amplifiers, enabling dynamic pulse shaping and adaptive adjustments to RF power levels, pulse durations, and phases, thus enabling more flexible imaging sequences and artifact reduction. Traditional RF amplifiers are characterized by high power output, as they rely on pulsed signal transmission.

Conventional MRI scanners have an RF transmit chain that obtains MRI signal information in the period following a large, powerful Radio Frequency (B1) pulse of energy. The MRI signal is actually present during the RF pulse; however, it is orders of magnitude lower in signal power. As such, the MRI signal is acquired when the B1 signal is not present or gated off. This is accomplished by gating (or shutting down) the RF amplifier output stages while the MRI signal is being acquired. This gating and pulsing of the RF signal requires substantial power output, making MRIs cost-prohibitive in and hence inaccessible for a large percentage of the world's population.

While significant progress has been made in optimizing RF power amplifiers for MRI applications, challenges persist in achieving the ideal balance of high-power output, efficiency, linearity, signal control and cost. Therefore, there is a continued need for innovation in the field of MRI RF power amplifiers to further improve imaging performance, reduce power output and cost, and enhance the patient's overall MRI experience.

SUMMARY OF THE INVENTION

It is therefore an object of the invention to provide a novel MRI RF amplifier that has significantly reduced power output, while providing improved imaging performance and patient experience. This patent application addresses such needs by disclosing novel and advantageous techniques for RF power amplification in the context of magnetic resonance imaging.

The present invention provides a way to simultaneously receive the MRI signal while the B1 signal is being transmitted, thus eliminating the need for pulsing of the B1 signal, and reducing power output. The invention accomplishes this objective by an RF Amplifier system for a magnetic resonance imaging (MRI) apparatus, comprising a radio frequency power amplifier configured to transmit a B1 radiofrequency signal to a patient coil present in the MRI apparatus, first through a directional coupler connected to the amplifier. The directional couple samples the B1 signal from the amplifier into a transmitted B1 signal and a B1 "error" signal, and then to a circulator connected to the directional coupler. The circulator is configured to transmit the transmitted B1 signal to a patient coil. The signals received from the patient in the patient coil are directed away from the RF amplifier output by the circulator and fed to an inline second directional coupler.

The second directional coupler receives the MRI signal and reflected B1 signal from the circulator. This coupler also receives the B1 error signal from the first directional coupler. These signals travel to a third directional coupler which splits off a control loop signal for analysis in a control loop. The components of the control loop modify the B1 error signal so as to continually equal the reflected B1 signal so that the B1 error signal cancels the B1 reflected signal at the second directional coupler. This, way the signal transmitted to the third directional coupler via the second directional coupler consists only of the MRI signal, which is then sent to a low noise MRI signal amplifier and on to the diagnostic components of the MRI system for data analysis of the MRI signal.

The continuous cancellation of the reflected B1 signal by the adjusted B1 error signal allows the RF power amplifier to provide a constant B1 signal to the MRI patient coil. This reduces overall power output, as the signal does not need to pulsed on and off. In practice, a conventional amplifier requires 35,000 watts of pulsed RF power to generate a measurable MRI signal, while the RF power amplifier of the present invention requires only on the order of 100 watts.

The control loop has modules for adjusting the amplitude, time delay and phase of the B1 error signal such that when the error signal is injected into the $2^{nd}$ Directional Coupler:

The amplitude and time delay of the error signal are equal to that of the B1 reflected signal the phase of the error signal is 180 degrees out of phase with the B1 reflected signal.

The result is that the B1 error signal and the reflected B1 signal cancel each other with a net output of zero.

The third directional coupler provides a feedback signal to the control loop such that the control loop can automatically adjust the error signal's gain and phase in order to keep the B1 signal cancellation level amplitude as low as possible during changes in the amplitude and phase of the reflected B1 signal that can occur because of patient motion during the MRI scans.

As the control loop is designed to achieve a signal-null, it may start acquiring the MRI signal to reduce it inadvertently. In this event, the B1 error signal may be set to a frequency slightly offset from the optimum Larmor Frequency ("Off-Resonance") to reduce this performance anomaly. In addition, a pilot tone, close in frequency can be added to the B1 error signal to aid in cancellation of the reflected B1 signal.

To reduce the required amplitude and phase accuracy necessary to achieve extreme high levels of B1 signal cancellation, two or more control loops (with independent error signals can be "nested" to share the total cancellation level. This can be achieved by splitting the error signal from the RF amplifier, and directing the split signals to the different control loops.

The technical aspects of each component in the system will be described in more detail below:

The MRI RF power amplifier is a device used to amplify the power in the radio frequency (RF) signals generated in MRI systems. It increases the strength of the RF pulse power before it is transmitted into the patient's body to excite nuclear spins for imaging. The RF power amplifier takes the weak RF signal generated by the RF Synthesizer and amplifies it to a level suitable for effective excitation of nuclear spins and signal reception. The typical specification parameters are as follows:

Frequency Range: 63-128 MHz (for 1.5 T to 3 T MRI)
Output Power: 100 W or less
Gain: +40-60 dB
Impedance: 50 ohms
Efficiency: >50%
Linearity: High The MRI Transmit and Receiver Coils, also known as the patient coils, are specialized electromagnetic coils used in MRI machines. Transmit coils send out RF pulses to excite nuclear spins in a human subject, while receiver coils capture the emitted RF signals for image reconstruction. A single coil can also be used to transmit and receive as well. Transmit coils generate RF pulses to excite the magnetic nuclei, and receiver coils detect the resulting MR signals to create images. The typical specification parameters are as follows:

Coil type: Surface (receive-only) or Volume (transmit and receive)
Number of elements: 1, 2, 4-channel, 8-channel, 32-channel, etc.
Field strength: Designed for a specific MRI field strength (e.g., 1.5 T, 3 T, 7 T)
Coil size and shape: Sized to encompass the human head, body, knee, etc.
Sensitivity and SNR: High sensitivity for signal detection The radio frequency directional couplers are passive devices used to separate a direction-sensitive (forward or reflected) sample of the RF power on a main RF transmission line while allowing most of the RF amplifiers power to flow to the transmit coil. They are used in MRI systems for power monitoring and control, allowing a small, sample size portion of the RF signal to be directed to other components like power meters or feedback loops. The typical specifications are as follows:

Coupling Factor: 30-60 dB
Frequency Range: 63-128 MHz (for 1.5 and 3 T MRIs)
Isolation: >−50 dB
Directivity: >20 dB
Connector Type: N, SMA, etc.

The radio frequency circulator is a non-reciprocal device used to restrict and control the direction of RF signal flow in a one-way path. In MRI systems, circulators ensure that RF power is directed from the amplifier to the transmit coil and prevents power from returning to the amplifier, protecting it from reflected power, and redirecting the MRI signal and reflected B1 signal to a cancellation loop. The circulator has the following typical specification parameters:

Frequency Range: 63-128 MHz in narrowband frequency ranges
Insertion loss: <−0.5 dB
Isolation: >−20 dB
Power handling: Several watts to kilowatts
Connector Type: N, SMA, etc.

The automatic control feedback loop for automatic gain and phase locking is a feedback control system that monitors and adjusts the gain and phase of various RF components to maintain optimal signal cancellation performance in the system according to the invention. It ensures that the MRI system maintains stable signal cancellation levels and phase relationships, essential for effective B1 signal reduction. The typical specification parameters can vary widely based on the specific MRI system and components used. The control loop has a selectable switch option to either allow for direct processing at the B1 input frequency, or processing at a down converted IF frequency via a local oscillator/mixer arrangement.

The low noise amplifier (LNA) in MRI systems is specifically designed to amplify weak MRI signals received by the receiver coil while introducing minimal additional noise. The LNA enhances the signal-to-noise ratio (SNR) of received signals, which is crucial for improving image quality. The typical specification parameters are as follows:

Frequency Range: 63-128 MHz (for 1.5 T to 3 T MRI)
Noise Figure: <1 dB
Gain: Variable, but typically 15-30 dB
Input/Output Impedance: 50 ohms
Power Supply: Typically, +12V The digital/analog attenuator is an electronic device used to control and adjust the amplitude of RF signals. In MRI systems, digital attenuators are used to control the RF signal power, enabling precise adjustments during transmit and receive phases. The typical specification parameters are as follows:

Frequency Range: 63-128 MHz (for 1.5 T to 3 T MRI)
Attenuation Range: 0-60 dB or more
Step Size: 1 dB or smaller or analog (continuously variable)
Insertion Loss: Typically, <−1 dB
Control Interface: Digital (e.g., TTL, or analog voltage)

The voltage-controlled phase shifter changes the phase of an RF signal in response to a control voltage. In MRI, phase shifters are used to adjust the phase of the RF B1 error signal, allowing fine-tuning of the B1 signal cancellation. The typical specification parameters are as follows:
- Frequency range: 63-128 MHz (for 1.5 T to 3 T MRI)
- Phase shift range: 0-360 degrees
- Step size: 1 degree or less, continuously variable
- Insertion loss: Typically, <−1 dB
- Control voltage range: variable (e.g., 0-5V)

The coaxial delay line is a passive transmission line used to introduce a controlled electrical delay in an RF signal. In MRI systems, coaxial delay lines are used to introduce precisely timed delays in RF pulses or signals for optimum cancellation. The typical specification parameters are as follows:
- Frequency range: 63-128 MHz (for 1.5 T to 3 T MRI)
- Delay range: Adjustable (e.g., nanoseconds to microseconds)
- Insertion loss: Typically, <−1 dB
- Impedance: 50 ohms
- Connector type: N, SMA, etc.

The frequency Synthesizer generates a Radio Frequency Signal in the range of 63-128 MHz (for 1.5 T to 3 T MRI) with the following parameter:
- Frequency: 63-128 MHz
- Output Power: 1 milliwatt (0 dBm)
- Capable of having its sine wave modified by Artificial Intelligence (AI) supervisory control (AISC):
  - Amplitude
  - Frequency
  - Phase
  - Time delay
  - Modulation types: amplitude, frequency, phase, frequency shift keyed, phase shift keyed These components are critical for the operation and performance of the system of the present invention, ensuring the generation and reception of high-quality images. The specifications may vary based on the specific MRI system and its field strength.

The present system utilizes an Automatic Gain Control (AGC) or Automatic Level Control (ALC), which is a closed-loop feedback control mechanism to maintain a consistent B1 signal cancellation level or signal strength in the presence of varying transmit coil impedance/VSWR values or changing patient motion or environmental conditions. The following describes how the AGC/ALC works and its significance:

The system works as follows:
1. Input Signal Monitoring: The system continuously monitors the B1 error signal level or strength. A pilot tone can also be monitored
2. Reference Level: The system is configured with a reference or target level that it aims to maintain. This reference level is typically set to achieve optimal system performance.
3. Control Element: The system includes a control element, often in the form of an amplifier or attenuator, placed after the input signal monitoring stage. This control element can adjust the gain or attenuation of the signal.
4. Feedback Loop: The key feature of the system is the closed-loop feedback mechanism. If the monitored signal level deviates from the reference level, the control element makes real-time adjustments to the signal strength to bring it back to the desired reference level.
5. Continual Adjustment: The system continuously adjusts the gain or attenuation/phase as long as there is a difference between the measured signal level and the reference level. This dynamic adjustment ensures that the output signal remains at a constant, desired level.
6. The Artificial Intelligence Supervisory Control (AISC) will work integral to the control loop and synthesizer to initially modify or "tag" key aspects of the synthesized B1 signal (amplitude, phase, time delay, frequency and various modulation formats) such that it can enable or better facilitate the systems ability to discern or differentiate the B1 signal from the MRI signal to further improve cancellation of the B1 signal.

The Artificial Intelligence Supervisory Control (AISC) is effectively contained/housed in a common high end personal computer, commonly referred to as a PC, which is a versatile electronic device designed for individual use. It consists of a combination of hardware (CPU/Memory) and software components that enable users to perform a wide range of tasks, including signal processing, A/D conversion, multimedia consumption, and software applications. In this specific case, it will run a program for RF sine wave signal modification, identification and cancellation The core hardware components typically include a central processing unit (CPU), memory (RAM), storage devices such as hard drives or solid-state drives, and input/output peripherals like a keyboard and mouse. This PC will interface through common interface protocols, (serial, USB, Parallel, Ethernet, GPIB) to transmit and receive commands and status to the RF synthesizer and control loops to control and cancel RF signals, learn and adapt to the MRI and B1 signal characteristics for optimum reflected B1 signal cancellation.

The Artificial Intelligence Supervisory Control (AISC) circuit will have the "designed-in" ability to acquire data from the synthesizer and control loop or loops and continuously learn the nature and characteristics of the reflected B1 signal and to adapt and oversee the control loop and RF synthesizer where it will have the ability to modify the input B1 sine wave signal characteristics such that it will be able to be better differentiated from the MRI signal thus allowing for enhanced reflected B1 signal cancellation.

The benefits of the system according to the invention are as follows:
1. Signal Stabilization: The system is crucial in scenarios where the coil impedance and VSWR level can vary significantly. In the context of the present invention, they help stabilize the cancellation signal values despite variations caused by differences in patient anatomy/motion, coil placement, or tissue properties.
2. Optimal Performance: By maintaining a consistent signal level, the system ensures that electronic components in the system operate in their linear regions. This is essential for obtaining high-quality images in MRI, as nonlinearities can introduce distortions and artifacts.
3. Reduced Operator Intervention: The present invention reduces the need for manual adjustments by operators, making the system user-friendly and less prone to human error.
4. Adaptation to Environmental Changes: The system of the present invention can adapt to changes in signal strength due to patient motion or environmental changes
5. Improved Signal-to-Noise Ratio: The system can enhance the Signal-to-Noise Ratio (SNR) by keeping the cancelled B1 signal at a minimized level, which is crucial for image quality.
6. Signal Integrity: The system helps maintain the integrity of the signal and prevents overdriving or underdriving sensitive components in the system.

In summary, the present system is integral for ensuring signal stability, system performance, and a seamless user experience. The ability to automatically adjust signal levels in response to changing conditions makes it essential for the optimal operation of an MRI, where transmit/receive coil parameters vary.

The system of the present invention will use substantially less RF power than a conventional MRI RF power amplifier to produce an MRI scan. This reduction in power will expose the patient to less RF energy and have less tissue heating. The reduction in power will result in a materially significant lowering in MRI system cost, this in tandem with improvements in MRI magnet cost can lower the overall total system price. Currently less than one third of the world's population has access to MRI scanner technology, as such, cost reduction efforts in magnet and amplifier technology will ultimately help bring MRI scanner technology to the remaining population.

BRIEF DESCRIPTION OF THE DRAWINGS

Other objects and features of the present invention will become apparent from the following detailed description considered in connection with the accompanying drawings. It is to be understood, however, that the drawings are designed as an illustration only and not as a definition of the limits of the invention.

In the drawings, wherein similar reference characters denote similar elements throughout the several views.

DETAILED DESCRIPTION OF THE PREFERRED EMBODIMENT

Figure 1:
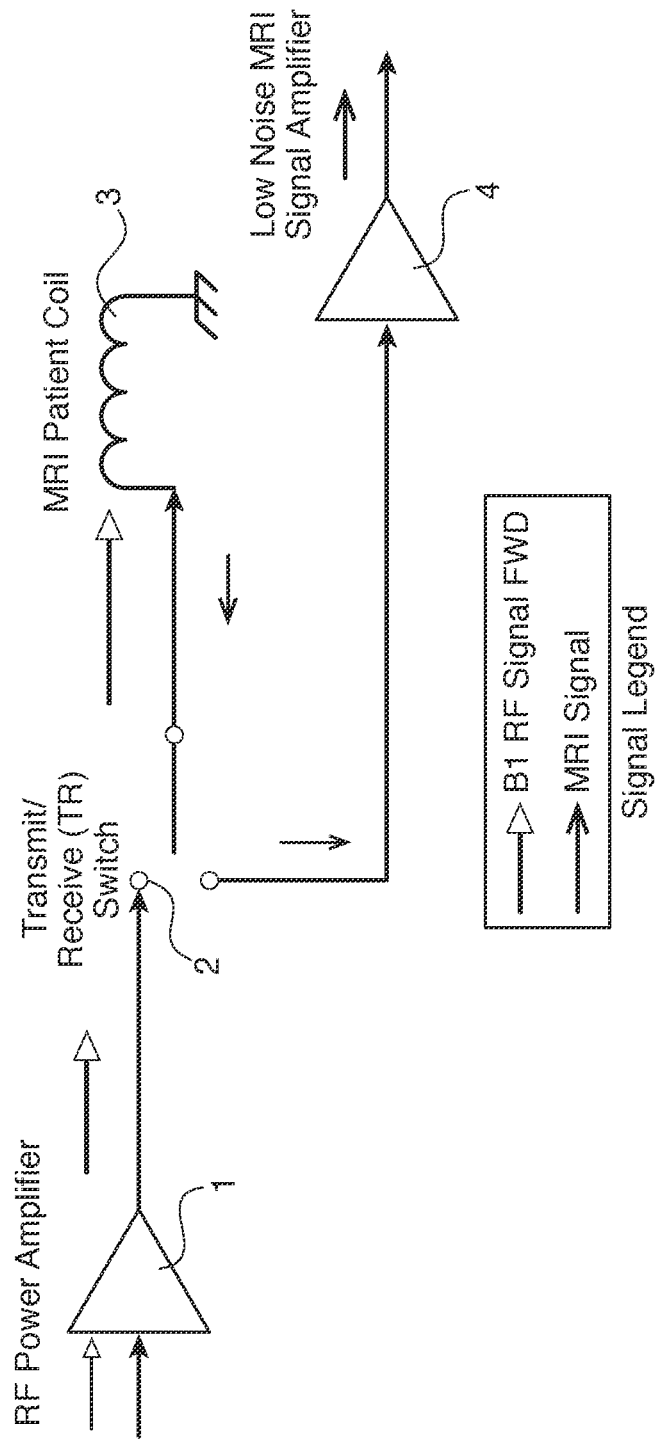
FIG. 1 shows a schematic diagram of a prior art RF MRI amplifier system.

Referring now in detail to the drawings and, in particular, FIG. 1 shows a prior art MRI amplifier system, which consists of an RF power amplifier 1 that sends a B1 signal through a transmit/receive switch 2 to a patient coil 3. An MRI signal is generated by the patient in the MRI apparatus, and is transmitted back to the transmit/receive switch 2 and on to a Low Noise MRI signal amplifier 4 and then on for analysis. Because the B1 signal is also transmitted back with the MRI signal, the MRI signal is often not detectable unless the RF power amplifier 1 turned off. Thus, the only way to reliably transmit and detect the MRI signal is to operate the RF power amplifier 1 in a pulsed configuration, so that the MRI signal can be detected between the pulses. However, pulsing the amplifier uses a lot of energy, making the system inefficient and costly to manufacture and operate.

To overcome this drawback, the system of the present invention provides a system that allows the RF power amplifier to operate in a simultaneous transmission/receive mode, yet allow the MRI signal to be detectable. The system according to the invention solves the problem of the B1 signal obscuring the MRI signal by providing a system that cancels the reflected B1 signal from the MRI coil, leaving only the MRI signal to be transmitted for analysis. The system according to the invention is shown in two different embodiments in FIGS. 2 and 3.

Figure 2:
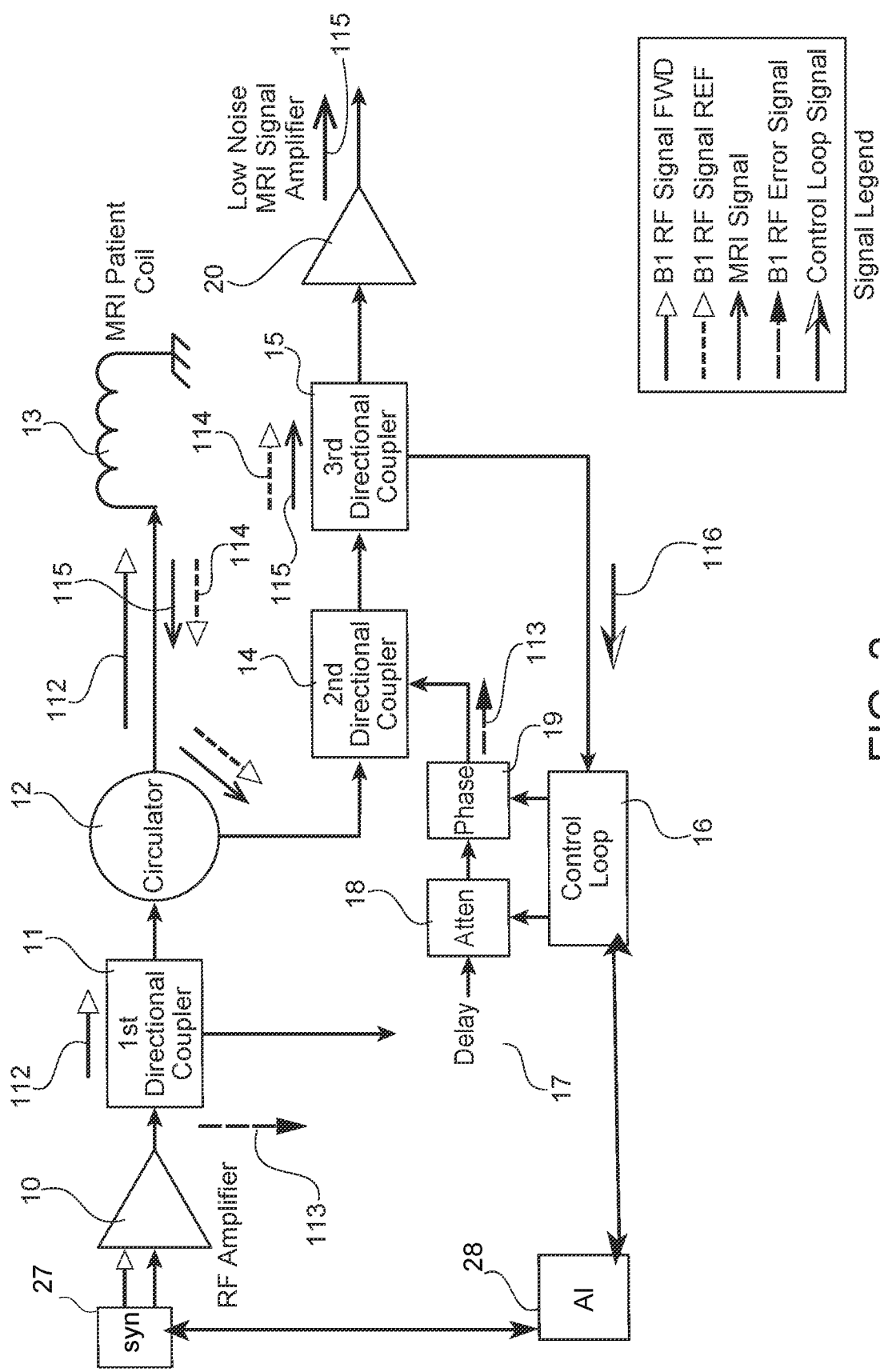
FIG. 2 shows a schematic diagram of the system according to the invention.

FIG. 2 shows a first embodiment of the system according to the invention.

A radio frequency synthesizer 27 generates the B1 signal. This synthesizer 27 receives direction from an artificial intelligence supervisory control (AISC) module 28. The AISC module 28 can instruct the synthesizer 27 to generate simple or complex B1 signals and control/modify the B1 signal characteristics in the following ways:
Amplitude
Phase
Frequency
Time Delay
Modulation formats; (amplitude, frequency, phase, frequency hopping algorithms, addition of pilot, co located carriers, phase shift keying and other formats)
These signal modifications may be used to further facilitate the identification of the B1 signal as it is characteristically very similar to the MRI signal).

The synthesizer 27 is connected to the RF amplifier 10, which is connected to a first directional coupler 11, which samples the B1 signal from amplifier 10 into the B1 RF signal 112 and a B1 RF error signal 113. The B1 RF signal then travels through a circulator 12 and on to the MRI patient coil 13, where it is used to generate the MRI signal 115 from the patient.

The MRI signal 115 is sent back to circulator 12, along with a reflected B1 signal 114 and then on to second directional coupler 14 and third directional coupler 15. Also fed into second directional coupler 14 and circulating within control loop 16 is the B1 error signal 113 from the first directional coupler 11. These signals are sent to the third directional coupler 15, which splits the transmitted signals, i.e., the B1 RF error signal, the B1 RF reflected signal, and the MRI signal, into a transmitted signal and a control loop signal 116 that is put through a control loop 16. The control loop functions to optimize the cancellation of the B1 signals in the system.

Control loop 16 contains a coaxial delay line 17, which acts to create a controlled delay of the B1 error signal. A digital/analog attenuator 18 is arranged to control and adjust the amplitude of the B1 RF error signal 113 so as to equal the B1 reflected signal component of the control loop signal, and a voltage-controlled phase shifter 19 is arranged to shift the phase of the B1 RF error signal 113 so as to be positioned 180 degrees from the B1 reflected signal component of the control loop signal 116. Thus, the B1 error signal, after passage through the delay line 17, attenuator 18 and phase shifter 19, is configured to cancel the B1 reflected signal as the two signals flow from the second directional coupler to the third directional coupler 15 and finally to the low noise signal amplifier 20. The B1 reflected signal and B1 error signals cancel each other, because the B1 error signal has the same frequency, amplitude, and timing of the B1 reflected or modulated signal components. This leaves only the MRI signal, which is then passed on to the Low Noise MRI signal amplifier for amplification and analysis.

At the third directional coupler 15, the combined signal is split off to create a control loop signal 116 that flows through the control loop 16, to continually refine the adjustments to the B1 error signal so that the cancellation of the B1 signals is optimized. The Artificial Intelligence Supervisory Control (AISC) 28 monitors the control loop and also controls the RF Synthesizer such that it can provide subtle B1 signal modifications with the purpose to help the control loop better single out and identify the B1 Reflected signal for high levels of accurate cancellation. This B1 signal may have modifications in (but not limited to) Amplitude, Phase, Frequency, Time Delay, Pilot Tone, Modulations (amplitude, frequency, phase), Frequency Hopping and Phase Shifting.

The control loop may also have a selectable switch option to allow for either direct processing at the B1 input frequency, or processing at a down converted IF frequency via a local oscillator/mixer arrangement.

Figure 3:
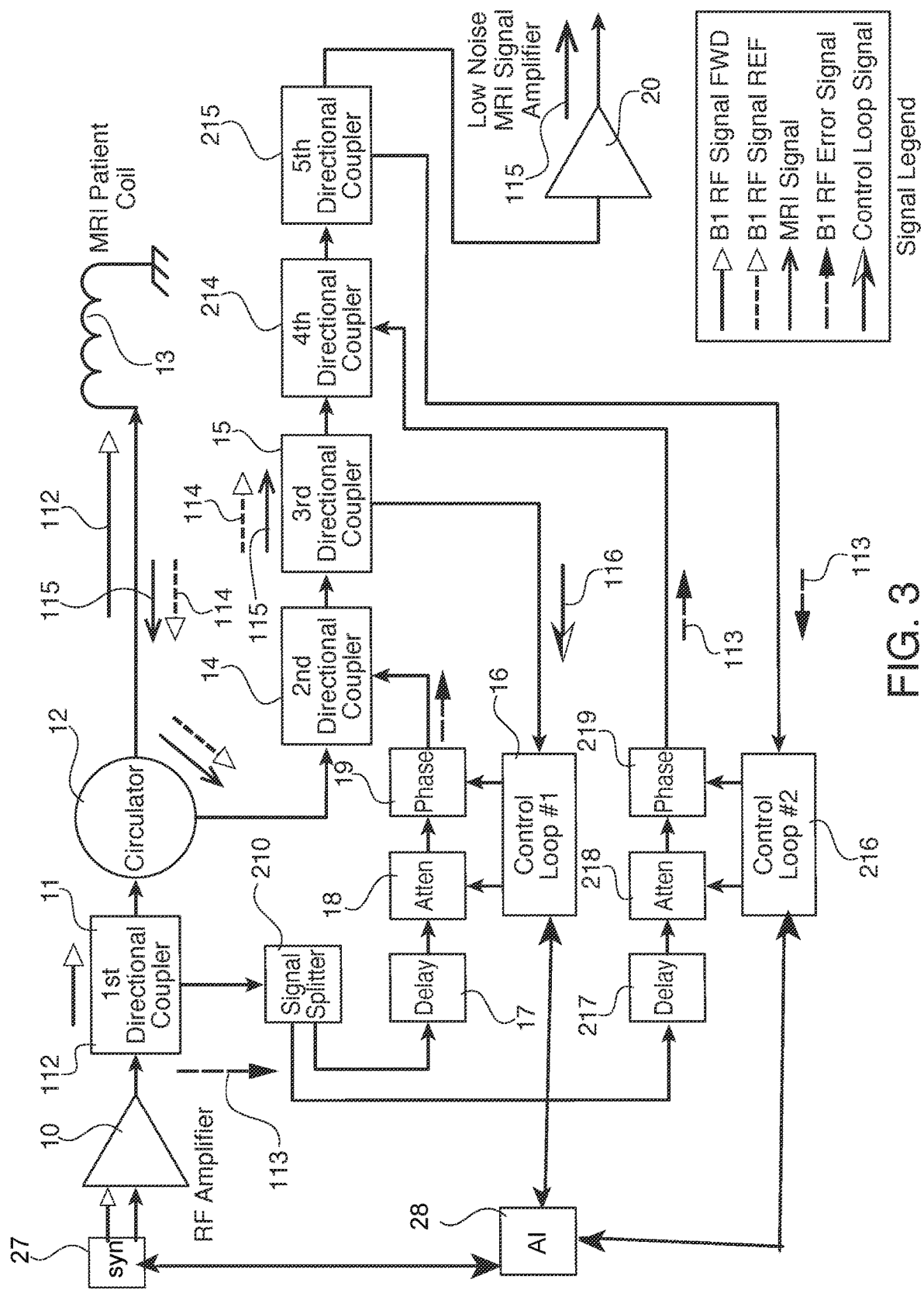
FIG. 3 shows a schematic diagram of an alternative embodiment of the system according to the invention.

FIG. 3 shows another embodiment of the invention, which contains a second control loop 216 for further adjustment and attenuation of the B1 error signal. In this case, the B1 error signal 113 travels through a signal splitter 210 and on to a second control loop 216, which contains a second coaxial delay line 217, a second attenuator 218 and a second phase shifter 219. The adjusted B1 error signal after traveling through second control loop 216 is transmitted to fourth directional coupler 214 and it is then fed back to second control loop 216 from fifth directional coupler 215 for continuous monitoring and adjustment of the B1 error signal, so that it fully cancels the B1 reflected signal 114 and provides only the MRI signal 115 to the amplifier 20. A third or even fourth control loop could also be provided if further precise adjustments of the B1 error signal 113 are desired.

Accordingly, while only a few embodiments of the present invention have been shown and described, it is obvious that many changes and modifications may be made thereunto without departing from the spirit and scope of the invention.

What is claimed is:

1. An amplifier system for a magnetic resonance imaging (MRI) apparatus, comprising:
a radio frequency power amplifier configured to transmit a B1 radiofrequency signal to a patient coil present in the MRI apparatus;
a first directional coupler connected to the amplifier, the first directional coupler being configured to sample the B1 signal from the amplifier into a transmitted B1 signal and a B1 error signal,
a circulator connected to the directional coupler and being configured to receive the transmitted B1 signal to a patient coil and receive and transmit a reflected B1 signal from the patient coil along with an MRI signal from the patient coil;
a second directional coupler connected to the circulator and being configured to transmit the MRI signal and reflected B1 signal received from the circulator;
a third directional coupler connected to the second directional coupler and being configured to split a received signal from the second directional coupler,
a control loop arranged between the second directional coupler and the third directional coupler, the control loop being configured to receive the B1 error signal from the first directional coupler, and receive the MRI signal and reflected B1 signal from the third directional coupler, wherein the control loop is configured for adjusting the B1 error signal so as to equal the reflected B1 signal in amplitude and time delay but shift the phase of the B1 error signal by 180 degrees from the reflected B1 signal, so that the B1 error signal cancels the reflected B1 signal when the B1 signals are combined in the second directional coupler, and
a low noise MRI signal amplifier connected to the third directional coupler and being configured to receive an RF signal from the third directional coupler,
wherein due to the cancellation of the reflected B1 signal, only the MRI signal is transmitted by the third directional coupler to the low noise MRI signal amplifier.

2. The system according to claim 1, wherein control loop includes a voltage-controlled phase shifter that is configured to shift a phase of the B1 error signal.

3. The system according to claim 1, wherein the control loop includes a coaxial delay line that is configured to induce a controlled electrical delay into the B1 error signal.

4. The system according to claim 1, wherein the control loop includes a digital or analog attenuator that is configured to control and adjust an amplitude of the B1 error signal.

5. The system according to claim 4, wherein the attenuator is configured to continuously monitor the B1 error signal and compare it to a B1 reference signal.

6. The system according to claim 1, further comprising:
a signal splitter connected to the first directional coupler and being configured to split the B1 error signal, and
a fourth directional coupler connected to the third directional coupler,
a fifth directional coupler, which is connected to the fourth directional coupler, and
a second control loop arranged between the fourth directional coupler and the fifth directional coupler, the control loop being configured to receive the split B1 error signal from the signal splitter, and receive the MRI signal and any remaining reflected B1 signal from the third directional coupler, wherein the second control loop is configured for further adjusting the B1 error signal so as to equal the reflected B1 signal in amplitude and time delay but shift the phase of the B1 error signal by 180 degrees from the reflected B1 signal so that the B1 error signal cancels the reflected B1 signal in the control loop.

7. The system according to claim 6, wherein the second control loop includes a second voltage-controlled phase shifter.

8. The system according to claim 6, wherein the second control loop includes a second coaxial delay line that is configured to induce a controlled electrical delay into the B1 error signal.

9. The system according to claim 6, wherein the second control loop includes a second digital or analog attenuator that is configured to control and adjust an amplitude of the B1 error signal.

10. The system according to claim 1, further comprising a radio frequency synthesizer connected to the radio frequency power amplifier, the synthesizer being configured for generating the B1 signal and transmitting the B1 signal to the RF amplifier.

11. The system according to claim 1, further comprising an artificial intelligence supervisory control circuit connected to the synthesizer and the control loop, the artificial intelligence supervisory control circuit being configured to control the synthesizer to add signal modifications to the B1 signal in order to improve identification of the B1 signal in the presence of the MRI signal for enhanced B1 signal cancellation.

12. The system according to claim 11, wherein the artificial intelligence supervisory control circuit is configured to acquire and continuously learn the nature and characteristics of the reflected B1 signal and to adapt and oversee the control loop and synthesizer to modify the input B1 sine wave signal characteristics to differentiate the B1 signal from the MRI signal.

13. The system of according to claim 1, wherein the control loop has a selectable switch that is configured to either allow for direct processing at a B1 input frequency, or processing at a down converted IF frequency via a local oscillator/mixer arrangement.

* * * * *